US012628299B2

(12) United States Patent
Iseda

(10) Patent No.: US 12,628,299 B2
(45) Date of Patent: May 12, 2026

(54) STRUCTURE OF ELECTRONIC APPARATUS AND METHOD FOR ASSEMBLING ELECTRONIC APPARATUS

(71) Applicants: NEC Corporation, Tokyo (JP); NEC Platforms, Ltd., Kawasaki (JP)

(72) Inventor: Ayumu Iseda, Kanagawa (JP)

(73) Assignees: NEC Platforms, Ltd., Kanagawa (JP); NEC CORPORATION, Tokyo (JP)

( * ) Notice: Subject to any disclaimer, the term of this patent is extended or adjusted under 35 U.S.C. 154(b) by 238 days.

(21) Appl. No.: 18/281,667

(22) PCT Filed: Jan. 17, 2022

(86) PCT No.: PCT/JP2022/001279
§ 371 (c)(1),
(2) Date: Sep. 12, 2023

(87) PCT Pub. No.: WO2022/196065
PCT Pub. Date: Sep. 22, 2022

(65) Prior Publication Data
US 2024/0172382 A1      May 23, 2024

(30) Foreign Application Priority Data
Mar. 18, 2021      (JP) ................................. 2021-044793

(51) Int. Cl.
H05K 7/02          (2006.01)
H05K 7/14          (2006.01)
H05K 7/20          (2006.01)

(52) U.S. Cl.
CPC ............. *H05K 7/02* (2013.01); *H05K 7/1427* (2013.01); *H05K 7/20336* (2013.01)

(58) Field of Classification Search
CPC .... H05K 7/02; H05K 7/1427; H05K 7/20336; H01L 23/367; H01L 23/3735; H01L 23/427; H01L 23/4922; H01L 23/49811
(Continued)

(56) References Cited

U.S. PATENT DOCUMENTS 5,297,025 A * 3/1994 Shoquist .............. H05K 5/0247
361/752
5,424,916 A * 6/1995 Martin ............... H05K 7/20636
361/698
(Continued)

FOREIGN PATENT DOCUMENTS

EP          3116292 A1     1/2017
JP          S53-079269 A     7/1978
(Continued)

OTHER PUBLICATIONS

International Search Report for PCT Application No. PCT/JP2022/001279, mailed on Mar. 29, 2022.
(Continued)

*Primary Examiner* — Tuan T Dinh
(74) *Attorney, Agent, or Firm* — Sughrue Mion, PLLC

(57) ABSTRACT

According to the present disclosure, an electronic apparatus comprises: a heat radiation member including a main body portion having a plate shape; an upper circuit board provided on a front surface portion of the main body portion; a lower circuit board provided on a rear surface portion of the main body portion; and a housing having a bottomed box shape in which the main body portion, the upper circuit board, and the lower circuit board are housed, wherein a guide portion is formed on the housing, and the guide portion guides the main body portion to a position in which contact between the lower circuit board and the housing is avoided when the main body portion is inserted from a through-hole of a wall surface portion of the housing into the housing in a state
(Continued)

where the lower circuit board is attached to the main body portion.

9 Claims, 13 Drawing Sheets

(58) Field of Classification Search
USPC ................ 361/690–710, 756–759, 711–714; 174/15.2; 165/80.4
See application file for complete search history.

(56) References Cited

U.S. PATENT DOCUMENTS

| | | | | |
|---|---|---|---|---|
| 5,504,924 | A | * | 4/1996 | Ohashi ................... H05K 7/208 |
| | | | | 361/676 |
| 5,508,908 | A | * | 4/1996 | Kazama ............. H05K 7/20936 |
| | | | | 174/15.2 |
| 6,292,363 | B1 | * | 9/2001 | Shinohara ............. H02M 7/003 |
| | | | | 174/15.2 |
| 7,551,438 | B2 | * | 6/2009 | Seki ................... H05K 7/20772 |
| | | | | 165/80.4 |
| 7,839,640 | B2 | * | 11/2010 | Hayashi ................... G06F 1/20 |
| | | | | 165/80.4 |
| 8,498,113 | B2 | * | 7/2013 | Tran ................... H03M 13/2963 |
| | | | | 361/679.01 |
| 10,952,352 | B2 | * | 3/2021 | Qu ............................ F28F 3/02 |

FOREIGN PATENT DOCUMENTS

| | | | |
|---|---|---|---|
| JP | S58-180692 | A | 12/1983 |
| JP | H05-063385 | A | 3/1993 |
| JP | 2001-028487 | A | 1/2001 |
| JP | 2003-133749 | A | 5/2003 |
| JP | 2007-035741 | A | 2/2007 |
| JP | 2013-229607 | A | 11/2013 |
| JP | 2020-053570 | A | 4/2020 |
| JP | 2020-126940 | A | 8/2020 |

OTHER PUBLICATIONS

English translation of Written opinion for PCT Application No. PCT/JP2022/001279, mailed on Mar. 29, 2022.
DE Office Communication for DE Application No. 112022000713.3, mailed on Dec. 5, 2025 with English Translation.

* cited by examiner

STRUCTURE OF ELECTRONIC APPARATUS AND METHOD FOR ASSEMBLING ELECTRONIC APPARATUS

This application is a National Stage Entry of PCT/JP2022/001279 filed on Jan. 17, 2022, which claims priority from JP Patent Application 2021-044793 filed on Mar. 18, 2021, the contents of all of which are incorporated herein by reference, in their entirety.

TECHNICAL FIELD

The present disclosure relates to a structure of an electronic apparatus and a method for assembling the electronic apparatus.

BACKGROUND ART

In an electronic apparatus such as a communication device (for example, a base station device), a heat radiation member that uses a so-called "heat pipe" and includes a main body portion having a substantially plate shape is used. A member (for example, a circuit board) being a target of heat radiation is provided on both surface portions of such a main body portion having the substantially plate shape. The main body portion of the heat radiation member and the member being the target of heat radiation are housed in a housing having a substantially box shape (see, for example, a paragraph and FIG. 4 in PTL 1).

CITATION LIST

Patent Literature

PTL 1: Japanese Unexamined Patent Application Publication No. H05-063385

SUMMARY OF INVENTION

Technical Problem

In general, when the electronic apparatus as described above is assembled, from a viewpoint of facilitating such assembly, work for vertically flipping the housing with respect to a horizontal plane is required to be made unnecessary. Meanwhile, when the electronic apparatus as described above is assembled, a circuit board may contact the housing, and thus a circuit part mounted on the circuit board may break. From a viewpoint of avoiding occurrence of such breakage, the contact between the circuit board and the housing is required to be avoided.

An object of the present disclosure is, in view of the problem described above, to provide a structure and an assembly method that are able to avoid contact of a circuit board with a housing when work for vertically flipping the housing at a time of assembly of an electronic apparatus is made unnecessary.

Solution to Problem

A structure of an electronic apparatus according to one aspect of the present disclosure includes: a heat radiation member including a main body portion having a plate shape; an upper circuit board provided on a front surface portion of the main body portion; a lower circuit board provided on a rear surface portion of the main body portion; and a housing having a bottomed box shape in which the main body portion, the upper circuit board, and the lower circuit board are housed, wherein a guide portion is formed in the housing, and the guide portion guides the main body portion to a position in which contact between the lower circuit board and the housing is avoided when the main body portion is inserted into the housing from a through hole of a wall surface portion of the housing in a state where the lower circuit board is attached to the main body portion.

A method for assembling an electronic apparatus according to one aspect of the present disclosure includes: a step of inserting a main body portion having a plate shape of a heat radiation member from a through hole of a wall surface portion of a housing having a bottomed box shape into the housing in a state where a lower circuit board is attached to a rear surface portion of the main body portion; a step of attaching an upper circuit board to a front surface portion of the main body portion in a state where the main body portion is inserted from the through hole into the housing; and guiding the main body portion to a position in which contact between the lower circuit board and the housing is avoided, by the main body portion abutting a guide portion of the housing when the main body portion is inserted from the through hole into the housing.

Advantageous Effects of Invention

According to the present disclosure, a structure and an assembly method that are able to avoid contact of a circuit board (particularly, a lower circuit board) with a housing are able to be provided when work for vertically flipping the housing at a time of assembly of an electronic apparatus is made unnecessary.

EXAMPLE EMBODIMENT

Hereinafter, example embodiments of the present disclosure are described in detail with reference to accompanying drawings.

First Example Embodiment

Figure 1:
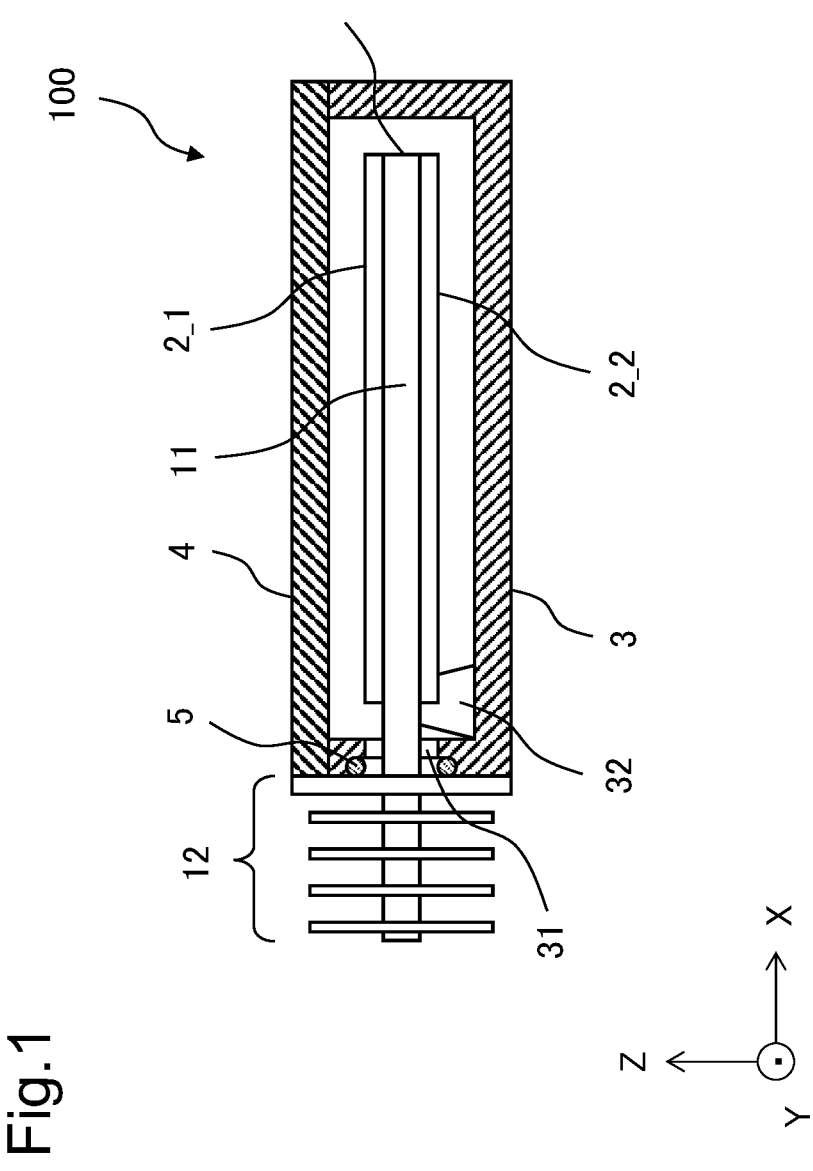
FIG. 1 is an explanatory diagram illustrating an overview of a structure of an electronic apparatus according to a first example embodiment.

FIG. 1 is an explanatory diagram illustrating an overview of a structure of an electronic apparatus according to a first example embodiment. The structure of the electronic apparatus according to the first example embodiment is described with reference to FIG. 1.

An X axis indicates a virtual axis along a front-back direction of an electronic apparatus 100 in the drawing. A direction of the X axis is associated with a direction directed from the back toward the front of the electronic apparatus 100. Further, a Y axis indicates a virtual axis along a left-right direction of the electronic apparatus 100 in the drawing. A direction of the Y axis is associated with a direction directed from the right toward the left of the electronic apparatus 100. Further, a Z axis indicates a virtual axis along an up-down direction of the electronic apparatus 100 in the drawing. A direction of the Z axis is associated with a direction directed from the bottom toward the top of the electronic apparatus 100. Note that a virtual plane (i.e., an XY plane) defined by the X axis and the Y axis is associated with a horizontal plane.

As illustrated in FIG. 1, the electronic apparatus 100 includes a heat radiation member 1. The heat radiation member 1 uses, for example, a heat pipe. In other words, the heat radiation member 1 includes a main body portion 11 having a substantially plate shape (more specifically, a substantially rectangular plate shape). A heat sink 12 is provided on a back end portion of the heat radiation member 1 (i.e., a back end portion of the main body portion 11). Further, the heat pipe (not illustrated) is provided along a plate surface portion of the main body portion 11. The heat pipe is thermally connected to the heat sink 12. The heat sink is cooled by an air cooling fan (not illustrated). In this way, a main unit of the heat radiation member 1 is formed.

The heat radiation member 1 is a so-called "double-sided mounting type". In other words, a circuit board 2 is provided on plate surface portions on both sides of the main body portion 11. More specifically, a circuit board (hereinafter may be referred to as an "upper circuit board") 2_1 is attached to one (a surface facing upward with respect to the horizontal surface, hereinafter referred to as a "front surface portion") of the plate surface portions of the main body portion 11. Further, another circuit board (hereinafter may be referred to as a "lower circuit board") 2_2 is attached to the other plate surface portion (a surface facing downward with respect to the horizontal surface, hereinafter referred to as a "rear surface portion") of the main body portion 11. Various circuit parts (not illustrated) for achieving a function of the electronic apparatus 100 are mounted on the circuit boards 2. The heat radiation member 1 is provided in order to radiate heat when the circuit parts generate the heat.

The main body portion 11, the upper circuit board 2_1, and the lower circuit board 2_2 are housed in a housing 3. Herein, a shape of the housing 3 is a substantially shallow box shape and a substantially bottomed box shape. In other words, a top portion of the housing 3 is open, and a lid 4 is provided along the top portion of the housing 3. The housing 3 and the lid 4 are made of, for example, an aluminum alloy. The upper circuit board 2_1 is disposed in such a way as to face the lid 4. Meanwhile, the lower circuit board 2_2 is disposed in such a way as to face a bottom portion of the housing 3.

As described above, the shape of the housing 3 is the substantially bottomed box shape. Further, as illustrated by using the X axis and the Y axis in FIG. 1, the front-back direction and the left-right direction are defined in the electronic apparatus 100. Thus, the housing 3 includes a back portion, a side portion, and a front portion in addition to the bottom portion. Hereinafter, the back portion, the side portion, or the front portion of the housing 3 may be collectively referred to as a "wall surface portion". A through hole 31 having a single slit shape (more specifically, a horizontal slit shape) is formed in the wall surface portion of the housing 3. In the example illustrated in FIG. 1, the through hole 31 is formed in the back portion of the housing 3. Hereinafter, an example when the through hole 31 is formed in the back portion of the housing 3 is mainly described.

The main body portion 11 of the heat radiation member 1 is inserted through the through hole 31. In this way, the main body portion 11, the upper circuit board 2_1, and the lower circuit board 2_2 are disposed inside the housing 3, and the heat sink 12 is disposed outside the housing 3. A waterproof member 5 is provided along a circumference of the through hole 31. The waterproof member 5 uses, for example, a gasket made of rubber. The waterproof member 5 is provided in order to suppress entry of liquid such as water from the outside of the housing 3 into the housing 3.

In this way, a main unit of the electronic apparatus 100 is formed. The electronic apparatus 100 is, for example, a communication device (more specifically, a base station device for wireless communication).

Herein, a guide portion 32 for guiding the main body portion 11 when the main body portion 11 is inserted from the through hole 31 into the housing 3 is formed on the housing 3. The guide portion 32 achieves a function as follows.

In other words, when the main body portion 11 is inserted from the through hole 31 into the housing 3 in a state where the lower circuit board 2_2 is attached to the main body portion 11, the main body portion 11 abuts the guide portion 32. In such an abutment state, the main body portion 11 slides with the guide portion 32. In this way, the main body portion 11 is guided in a direction in which the main body portion 11 is held up. As a result of this, for a position in a height direction of the housing 3 (i.e., a height direction of the electronic apparatus 100), the main body portion 11 is guided to a position in which contact between the housing 3 and the lower circuit board 2_2 is avoided. A specific example of the guide portion 32 is described below with reference to FIGS. 3 and 4.

Next, a method for assembling the main unit of the electronic apparatus 100 is described with reference to FIGS. 2A to 2D.

Figure 2A:
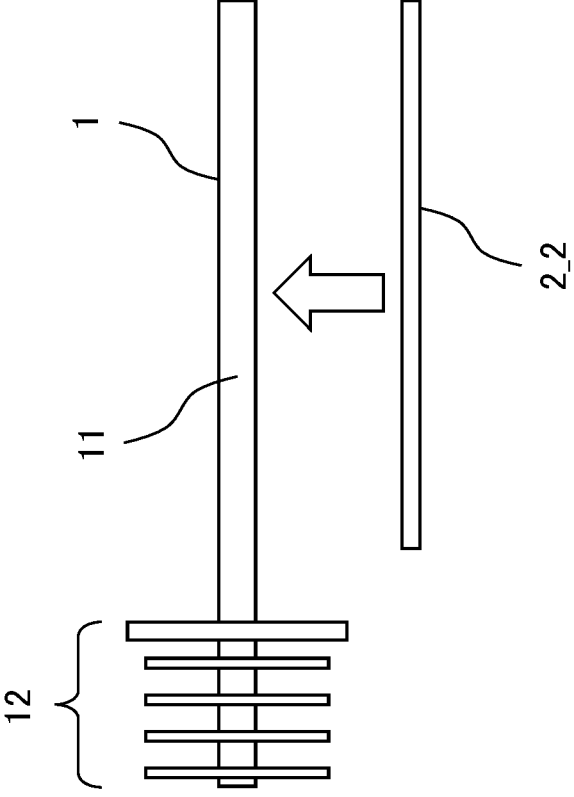
FIG. 2A is an explanatory diagram illustrating a first step in a method for assembling the electronic apparatus according to the first example embodiment.

First, as illustrated in FIG. 2A, an operator who is not illustrated attaches the lower circuit board 2_2 to the rear surface portion of the main body portion 11 (first step).

Figure 2B:
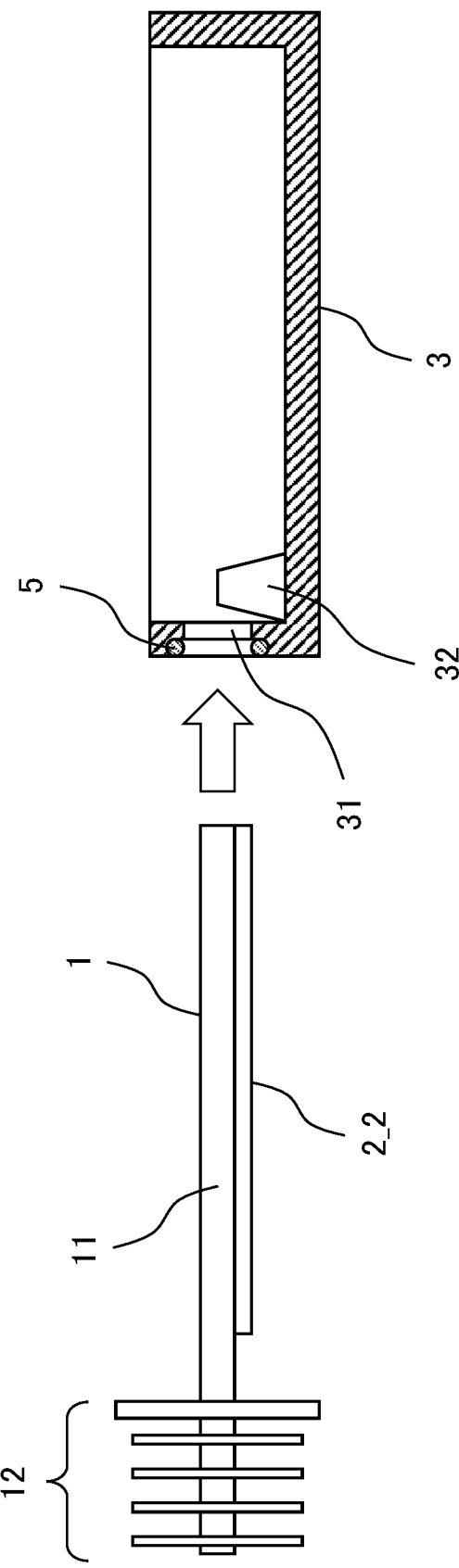
FIG. 2B is an explanatory diagram illustrating a second step in the method for assembling the electronic apparatus according to the first example embodiment.

Next, as illustrated in FIG. 2B, the operator inserts the main body portion 11 from the through hole 31 into the housing 3 (second step). At this time, as described above, the main body portion 11 abuts the guide portion 32. In such an abutment state, the main body portion 11 slides with the guide portion 32. In this way, the main body portion 11 is guided in a direction in which the main body portion 11 is held up. As a result of this, the main body portion 11 is guided to a position in which contact between the housing 3 and the lower circuit board 2_2 is avoided.

Note that the waterproof member 5 is attached to the housing 3 in advance. Further, the housing 3 is supported by a jig and the like that are not illustrated in a state where the bottom portion of the housing 3 faces downward (i.e., in a state where the top portion of the housing 3 faces upward).

Figure 2C:
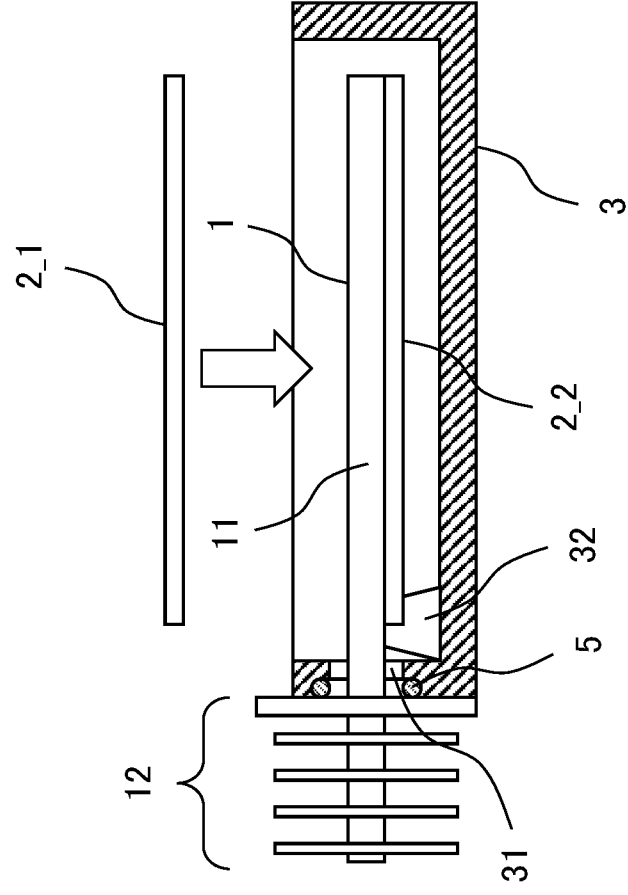
FIG. 2C is an explanatory diagram illustrating a third step in the method for assembling the electronic apparatus according to the first example embodiment.
Figure 2D:
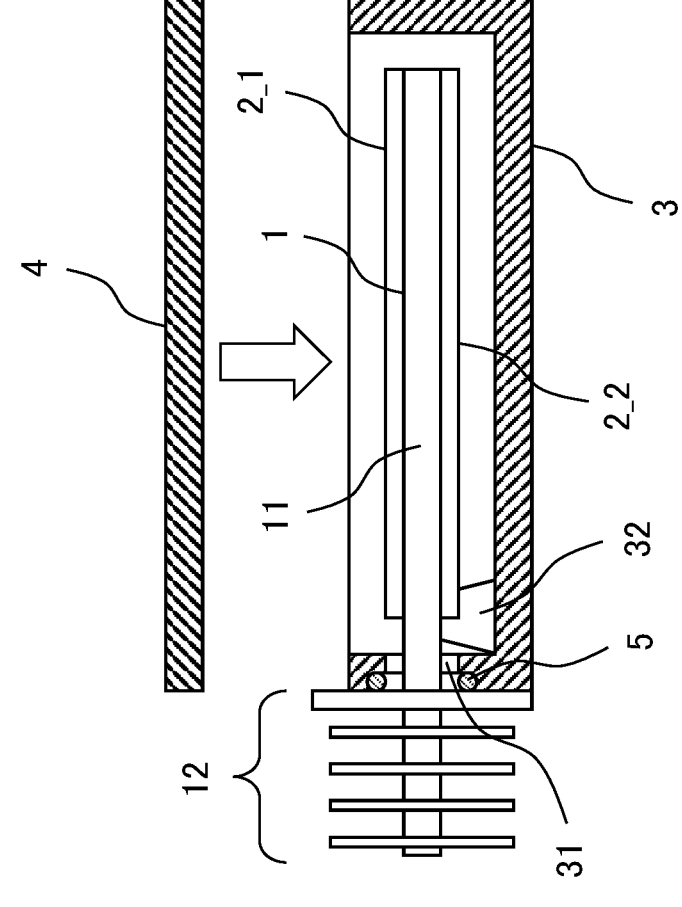
FIG. 2D is an explanatory diagram illustrating a fourth step in the method for assembling the electronic apparatus according to the first example embodiment.

Next, as illustrated in FIG. 2C, the operator attaches the upper circuit board 2_1 to the front surface portion of the main body portion 11 (third step). Next, as illustrated in FIG. 2D, the operator attaches the lid 4 to the top portion of the housing 3 (fourth step). As illustrated in FIGS. 2C and 2D, the work is performed from above the housing 3. Particularly, the upper circuit board 2_1 is attached to the main body portion 11 from above the housing 3 by using the opening of the top portion of the housing 3 (see FIG. 2C).

Next, a specific example and the like of the guide portion 32 is described with reference to FIGS. 3 and 4.

The guide portion 32 is provided on both left and right sides of the through hole 31. In other words, a pair of left and right guide portions 32 is formed on the housing 3. FIGS. 3 and 4 illustrate one guide portion 32 of such a pair of guide portions 32.

A shape of the individual guide portion 32 is a substantially trapezoidal shape protruding from the bottom portion of the housing 3 in an upward direction, or a substantially trapezoidal shape protruding from a holding portion 36 described below in the upward direction. In the examples illustrated in FIGS. 3 and 4, the shape of the individual guide portion 32 is the substantially trapezoidal shape protruding from the holding portion 36 in the upward direction. The individual guide portion 32 includes an inclined surface portion (hereinafter referred to as a "first inclined surface portion", or simply referred to as an "inclined surface portion") 33 associated with one of legs of such a trapezoid. Further, the individual guide portion 32 includes a surface portion (hereinafter referred to as an "upper bottom portion") 34 associated with an upper bottom of such a trapezoid. Further, the individual guide portion 32 includes an inclined surface portion (hereinafter referred to as a "second inclined surface portion") 35 associated with the other leg of such a trapezoid.

Figure 3:
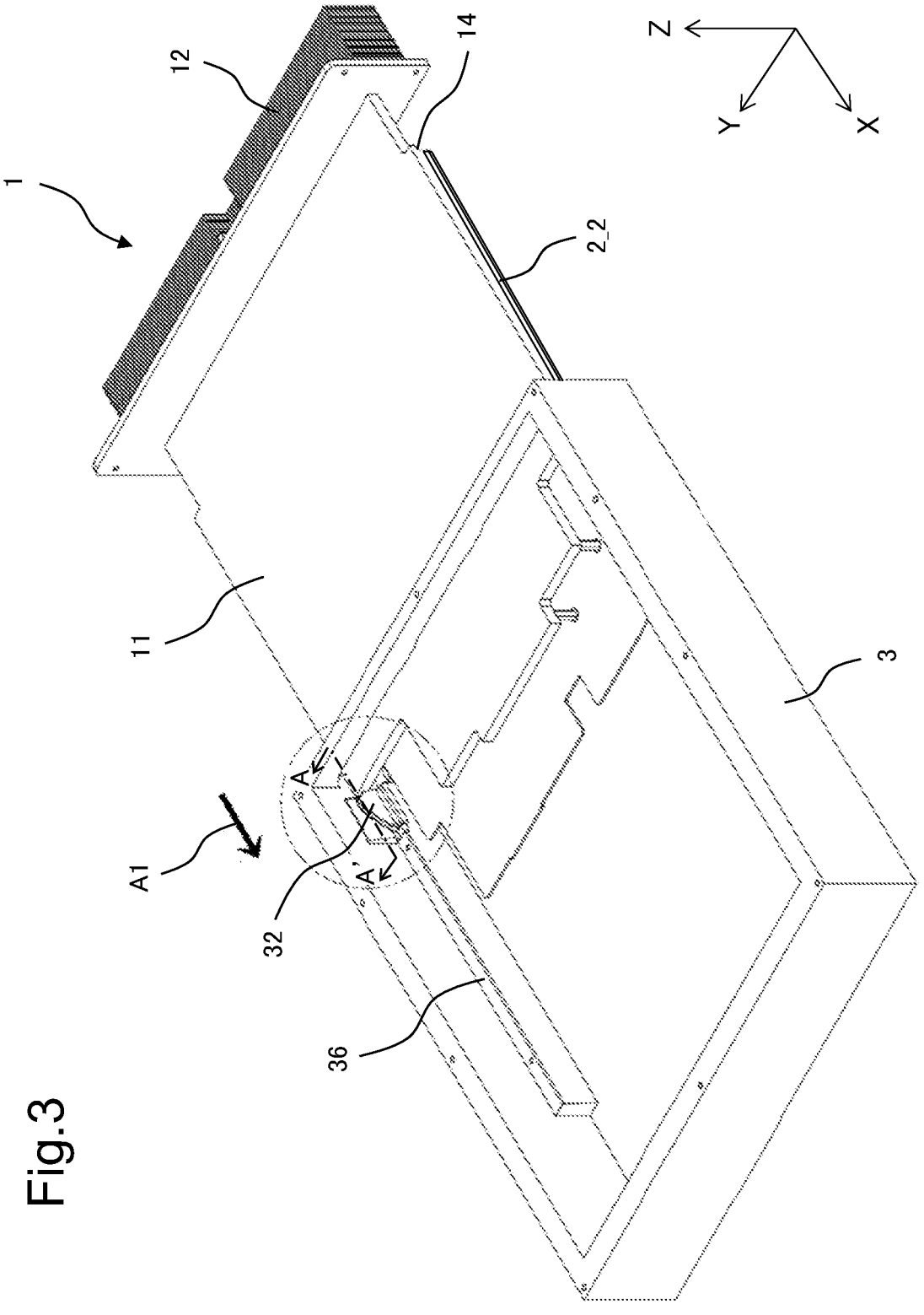
FIG. 3 is a perspective view illustrating an example of specific shapes of a heat radiation member, a lower circuit board, and a housing in the electronic apparatus according to the first example embodiment.
Figure 4:
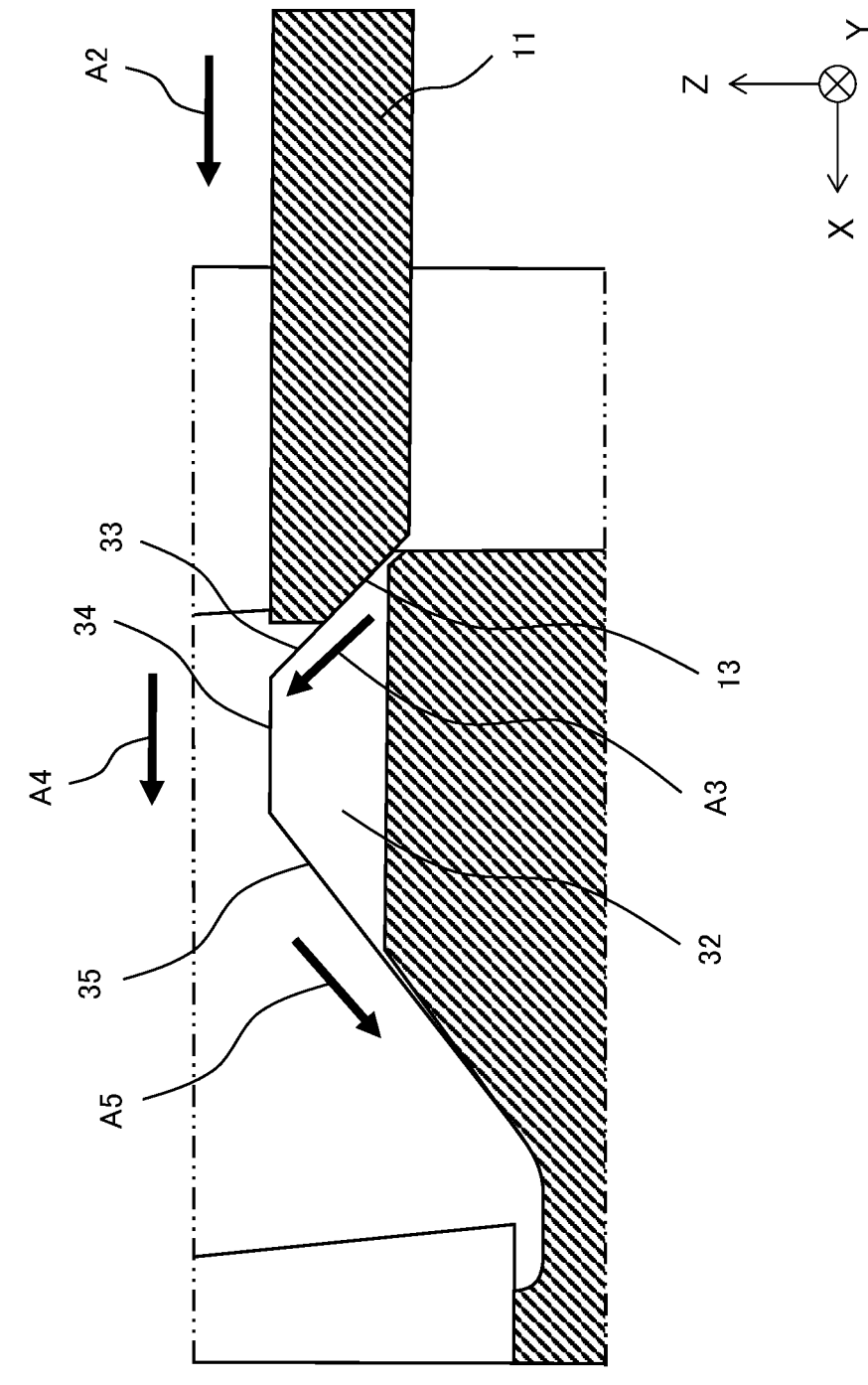
FIG. 4 is an enlarged cross-sectional view illustrating an example of a specific shape of a guide portion of the housing in the electronic apparatus according to the first example embodiment, and is a cross-sectional view in which a region surrounded by a chain double-dashed line in FIG. 3 is enlarged and cut along an A-A' line.

FIGS. 3 and 4 illustrate an intermediate state where the main body portion 11 is inserted from the through hole 31 into the housing 3. An arrow A1 in FIG. 3 indicates an insertion direction of the heat radiation member 1 with respect to the housing 3. In other words, the arrow A1 indicates a direction in which an operator applies a force to the heat radiation member 1 when the operator inserts the heat radiation member 1 into the housing 3.

Herein, as illustrated in FIG. 4, an inclined surface portion (hereinafter referred to as a "first abutment surface portion") 13 having a C-chamfered shape associated with the first inclined surface portion 33 is formed on both side portions in a predetermined position on a front end portion side of the heat radiation member 1 (i.e., a front end portion side of the main body portion 11). When the heat radiation member 1 is inserted into the housing 3, the individual first abutment surface portion 13 abuts the first inclined surface portion 33 of the associated guide portion 32. In such an abutment state, a force is applied in an insertion direction (see an arrow A2 in the drawing), and thus the individual first abutment surface portion 13 slides with the first inclined surface portion 33 of the associated guide portion 32. In this way, the main body portion 11 is guided in a direction in which the main body portion 11 is held up (see an arrow A3 in the drawing).

In this way, for a position in the height direction of the housing 3 (i.e., the height direction of the electronic apparatus 100), the main body portion 11 is guided to a position in which contact between the lower circuit board 2_2 and the housing 3 is avoided. In a state where the main body portion 11 is guided to such a position, the heat radiation member 1 is inserted into the housing 3 in such a way that both side portions of the rear surface portion of the main body portion 11 slide with the upper bottom portion 34 of the associated guide portion 32 (see an arrow A4 in the drawing).

Herein, as illustrated in FIG. 3, an inclined surface portion (hereinafter referred to as a "second abutment surface portion") 14 having a C-chamfered shape associated with the second inclined surface portion is formed on both side portions in a predetermined position on a back end portion side of the heat radiation member 1 (i.e., a back end portion side of the main body portion 11). When the substantially entire main body portion 11 is inserted into the housing 3, sliding between the rear surface portion of the main body portion 11 and the upper bottom portion 34 of the individual guide portion 32 ends, and the individual second abutment surface portion 14 abuts the second inclined surface portion 35 of the associated guide portion 32. In such an abutment state, the main body portion 11 is guided to a predetermined position in the housing 3 in such a way that the individual second abutment surface portion 14 slides with the second inclined surface portion 35 of the associated guide portion 32 (see an arrow A5 in the drawing).

In other words, the main body portion 11 is guided by such sliding in a direction in which the main body portion 11 slips down the second inclined surface portion 35 (see the arrow A5 in the drawing). As a result of this, the main body portion 11 is guided to the predetermined position in the housing 3. The holding portion 36 for holding the main body portion 11 in such a predetermined position is formed on the housing 3 (see FIG. 3).

Next, a comparison electronic apparatus 100' for the electronic apparatus 100 is described with reference to FIG. 5.

Figure 5:
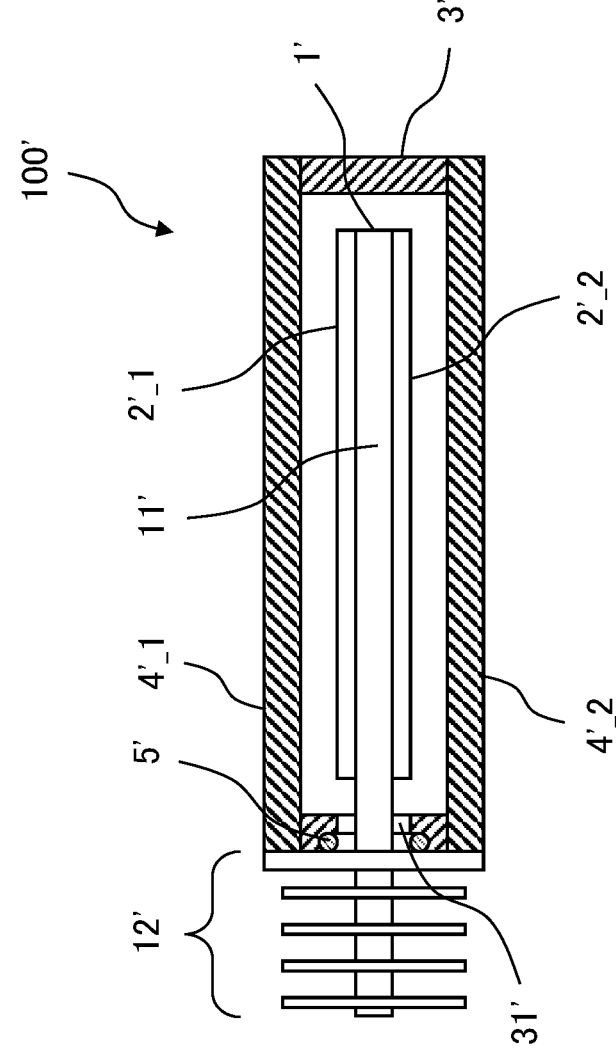
FIG. 5 is an explanatory diagram illustrating an overview of a structure of a comparison electronic apparatus.

As illustrated in FIG. 5, the electronic apparatus 100' includes a heat radiation member 1', an upper circuit board 2'_1, and a lower circuit board 2'_2. The heat radiation member 1', the upper circuit board 2'_1, and the lower circuit board 2'_2 are similar to the heat radiation member 1, the upper circuit board 2_1, and the lower circuit board 2_2 of the electronic apparatus 100, respectively. In other words, a main body portion 11' and a heat sink 12' of the heat radiation member 1' are similar to the main body portion 11 and the heat sink 12 of the heat radiation member 1, respectively. However, an inclined surface portion corresponding to the first abutment surface portion 13 is not formed on the main body portion 11'. Further, an inclined surface portion corresponding to the second abutment surface portion 14 is not formed on the main body portion 11'.

The main body portion 11' is inserted through a through hole 31' of a back portion of a housing 3'. Herein, in the housing 3', a top portion of the housing 3' is open and a bottom portion of the housing 3' is open. A lid (hereinafter referred to as a "top lid") 4'_1 is provided along the top portion of the housing 3'. Further, another lid (hereinafter referred to as a "bottom lid") 4'_2 is provided along the bottom portion of the housing 3'. The upper circuit board 2'_1 is disposed in such a way as to face the top lid 4'_1. Meanwhile, the lower circuit board 2'_2 is disposed in such a way to face the bottom lid 4'_2. Note that a portion corresponding to the guide portion 32 is not formed on the housing 3'.

A waterproof member 5' is provided along a circumference of the through hole 31'. The waterproof member 5' is similar to the waterproof member 5 of the electronic apparatus 100.

In this way, a main unit of the electronic apparatus 100' is formed.

Next, a method for assembling the main unit of the electronic apparatus 100' is described with reference to FIGS. 6A to 6D.

Figure 6A:
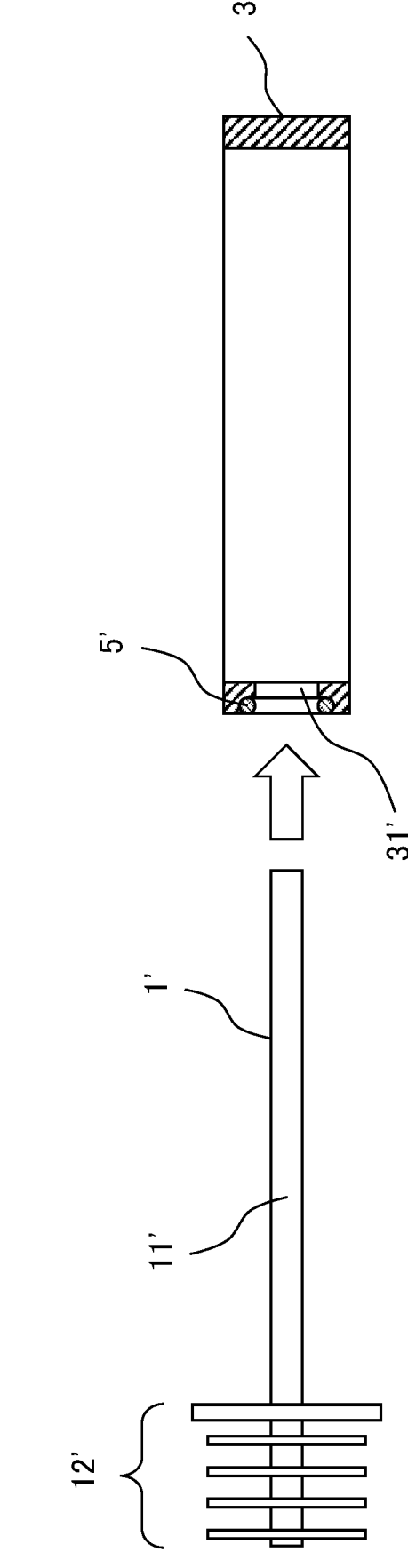
FIG. 6A is an explanatory diagram illustrating a first step in a method for assembling the comparison electronic apparatus.

First, as illustrated in FIG. 6A, an operator who is not illustrated inserts the main body portion 11' from the through hole 31' into the housing 3' (first step). Note that the waterproof member 5' is attached to the housing 3' in advance. Further, the housing 3' is supported by a jig and the like that are not illustrated in a state where the bottom portion of the housing 3' faces upward (i.e., in a state where the top portion of the housing 3' faces downward).

Figure 6B:
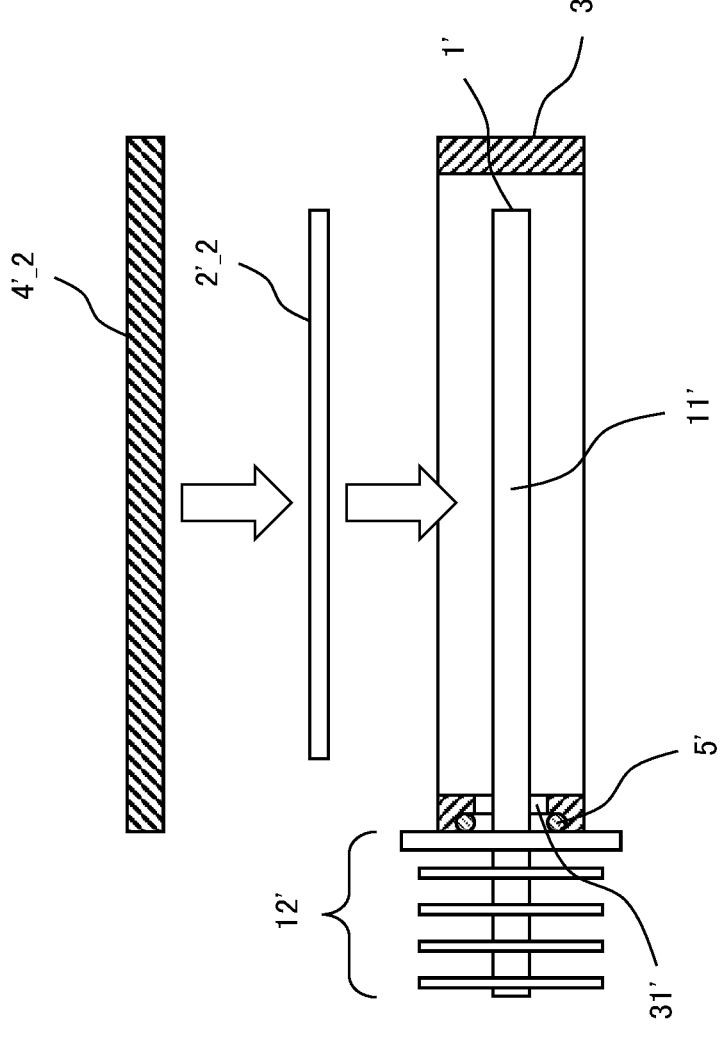
FIG. 6B is an explanatory diagram illustrating a second step in the method for assembling the comparison electronic apparatus.

Next, as illustrated in FIG. 6B, the operator attaches the lower circuit board 2'_2 to a rear surface portion of the main body portion 11', and attaches the bottom lid 4'_2 to the bottom portion of the housing 3' (second step). As illustrated in FIG. 6B, the work is performed from above the housing 3'. Particularly, the lower circuit board 2'_2 is attached to the main body portion 11' from above the housing 3' by using the opening of the bottom portion of the housing 3'.

Figure 6C:
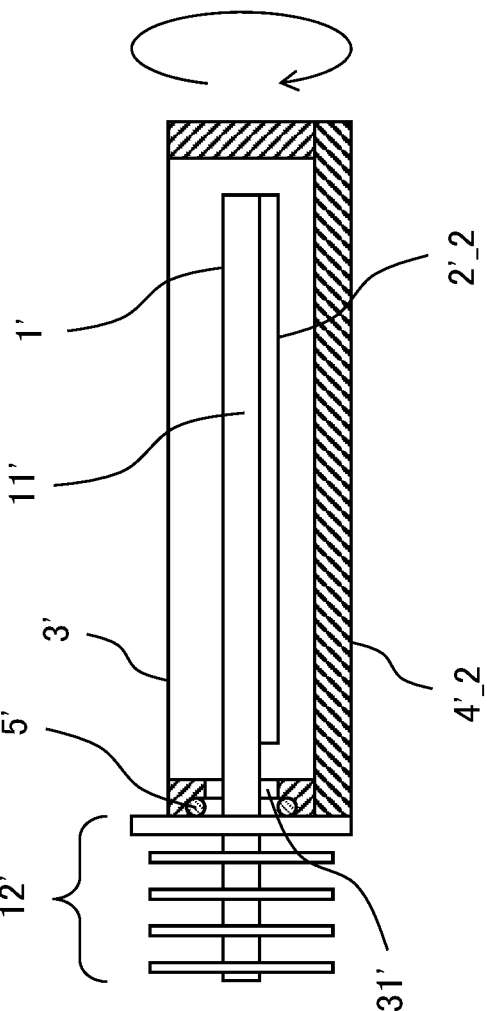
FIG. 6C is an explanatory diagram illustrating a third step in the method for assembling the comparison electronic apparatus.

Next, as illustrated in FIG. 6C, the operator vertically flips the housing 3' (third step). After such flipping, the housing 3' is supported again by a jig and the like in a state where the top portion of the housing 3' faces upward (i.e., in a state where the bottom portion of the housing 3' faces downward).

Figure 6D:
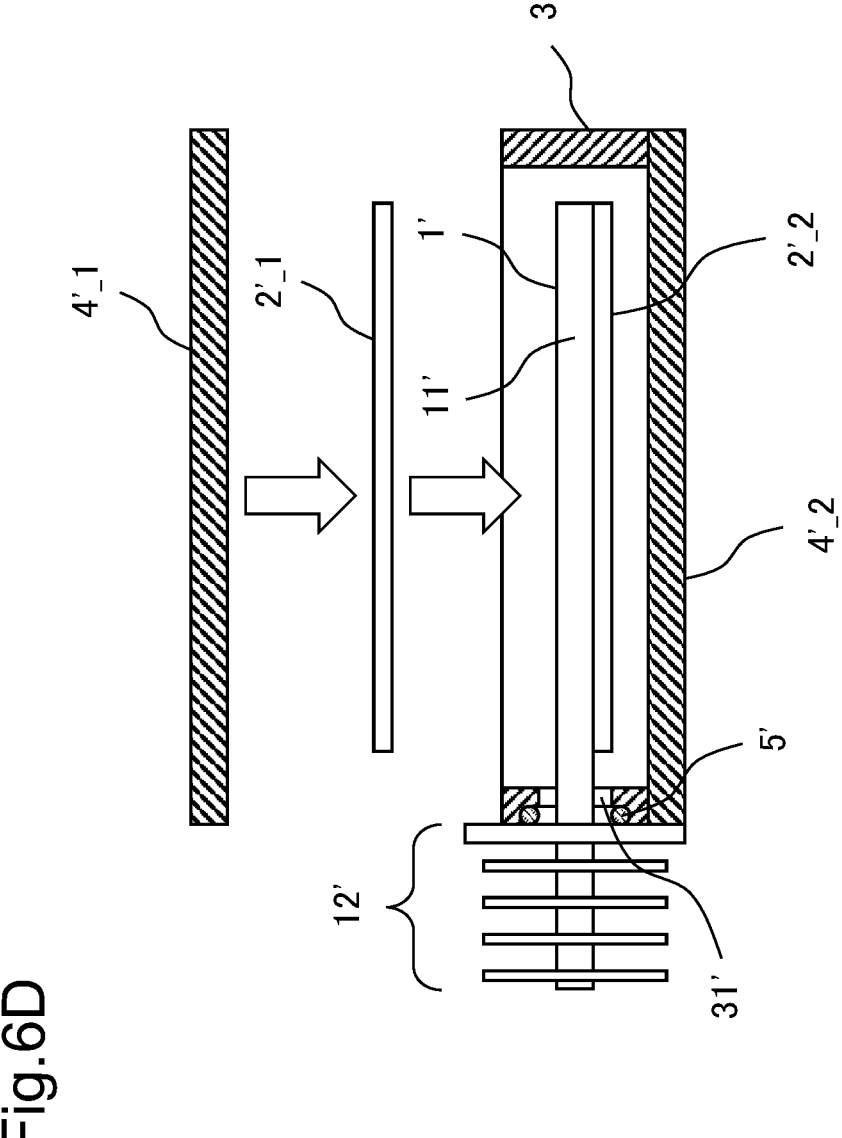
FIG. 6D is an explanatory diagram illustrating a fourth step in the method for assembling the comparison electronic apparatus.

Next, as illustrated in FIG. 6D, the operator attaches the upper circuit board 2'_1 to a front surface portion of the main body portion 11', and attaches the top lid 4'_1 to the top portion of the housing 3' (fourth step). As illustrated in FIG. 6D, the work is performed from above the housing 3'. Particularly, the upper circuit board 2'_1 is attached to the main body portion 11' from above the housing 3' by using the opening of the top portion of the housing 3'.

Next, a problem in the comparison electronic apparatus 100' is described. Further, an effect in the electronic apparatus 100 according to the first example embodiment is described.

As described with reference to FIG. 5, in the housing 3', the top portion of the housing 3' is open and the bottom portion of the housing 3' is open. Further, as described with reference to FIGS. 6A to 6D, the step of vertically flipping the housing 3' occurs when the electronic apparatus 100' is assembled. The reason is that the work in each step after the heat radiation member 1' is inserted into the housing 3' is performed from above the housing 3' (see FIGS. 6C and 6D).

Further, as described with reference to FIGS. 6A to 6D, when the electronic apparatus 100' is assembled, the upper circuit board 2'_1 and the lower circuit board 2'_2 are attached to the heat radiation member 1' after the heat radiation member 1' is inserted into the housing 3'. The reason is that occurrence of contact between the circuit boards 2' and the housing 3' is avoided at a time of such insertion.

Herein, a problem as follows occurs in the electronic apparatus 100'. First, the work for vertically flipping the housing 3' is required when the electronic apparatus 100' is assembled. In this way, a load on an operator is great particularly when the electronic apparatus 100' is large (for example, when the electronic apparatus 100' is a base station device for wireless communication). Further, a space required for such work is also large. In other words, a problem that so-called "workability" is low occurs. Secondly, a problem that the number of parts increases by using two lids 4' (more specifically, the top lid 4'_1 and the bottom lid 4'_2) occurs.

In contrast, in the electronic apparatus 100, as described with reference to FIGS. 2A to 2D, the heat radiation member 1 is inserted into the housing 3 after the lower circuit board 2_2 is attached to the heat radiation member 1. In other words, the heat radiation member 1 is inserted into the housing 3 in a state where the lower circuit board 2_2 is attached to the heat radiation member 1. In this way, the work in each step after the heat radiation member 1 is inserted into the housing 3 can be performed from above the housing 3 while making the work for vertically flipping the housing 3 unnecessary (see FIGS. 2C and 2D). Such flipping work is made unnecessary, and thus workability in assembly of the electronic apparatus 100 can be improved.

Further, the guide portion 32 is formed on the housing 3, and thus occurrence of contact between the lower circuit board 2_2 and the housing 3 can be avoided at a time of insertion of the heat radiation member 1. Note that, as described above, the upper circuit board 2_1 is attached to the heat radiation member 1 after the heat radiation member 1 is inserted into the housing 3. In this way, occurrence of contact between the upper circuit board 2_1 and the housing 3 can be avoided at a time of insertion of the heat radiation member 1.

Further, a shape of the housing 3 can be a substantially bottomed box shape in such an order of the assembly. In other words, a part corresponding to the bottom lid 4'_2 can be made unnecessary. In this way, the number of parts can be reduced as compared to the electronic apparatus 100' using the two lids 4'.

Next, another effect in the electronic apparatus 100 is described.

As described above, a shape of the through hole 31 is a horizontal slit shape. Hereinafter, a size of each member or a size of each portion in a longitudinal direction of the through hole 31 is simply referred to as a "size". A size $W2\_1$ of the upper circuit board 2_1 may be set to a value greater than a size $W1$ of the main body portion 11. Further, the size $W2\_1$ of the upper circuit board 2_1 may be set to a value greater than a size $W2\_2$ of the lower circuit board 2_2. Hereinafter, an example when $W2\_1$ is set to a value greater than each of $W1$ and $W2\_2$ is mainly described.

As described with reference to FIGS. 2A to 2D, the upper circuit board 2_1 is attached to the heat radiation member 1 after the heat radiation member 1 is inserted into the housing 3. In this way, a size of the housing 3 can be reduced as compared to that when the upper circuit board 2_1 is attached to the heat radiation member 1 before the heat radiation member 1 is inserted into the housing 3. As a result of this, a size of the electronic apparatus 100 can be reduced.

In other words, it is assumed that the upper circuit board 2_1 is attached to the heat radiation member 1 before the heat radiation member 1 is inserted into the housing 3. In this case, the main body portion 11, the upper circuit board 2_1, and the lower circuit board 2_2 are required to be inserted through the through hole 31 in a state where the waterproof member 5 is provided around the through hole 31. Thus, a size W of the housing 3 is required to be greater than at least β being a value acquired by adding 2α to W2_1. Herein, α is a size associated with a cross section diameter of the waterproof member 5.

Meanwhile, as described with reference to FIGS. 2A to 2D, it is assumed that the upper circuit board 2_1 is attached to the heat radiation member 1 after the heat radiation member 1 is inserted into the housing 3. In this case, as a first condition, the size W of the housing 3 is required to be greater than at least W2_1 from a viewpoint of housing the upper circuit board 2_1. Further, as a second condition, the main body portion 11 and the lower circuit board 2_2 are required to be inserted through the through hole 31 in a state where the waterproof member 5 is provided around the through hole 31. Thus, the size W of the housing 3 is required to be greater than at least γ being a value acquired by adding 2α to a greater value of W1 and W2_2. As a result, from a viewpoint of satisfying both of the first condition and the second condition, the size W of the housing 3 is required to be greater than at least δ being a greater value of W2_1 and γ.

To summarize the content above, equations (1) to (3) below hold true.

$$\beta = W2\_1 + 2\alpha \tag{1}$$

$$\gamma = \max(W1, W2\_2) + 2\alpha \tag{2}$$

$$\delta = \max(W2\_1, \gamma) \tag{3}$$

Herein, as described above, W2_1>W1 and W2_1>W2_2. Thus, β>δ. Therefore, by employing a structure to which the upper circuit board 2_1 is attached after insertion of the heat radiation member 1, a width (the size W) of the housing 3 can be reduced as compared to that when a structure to which the upper circuit board 2_1 is attached before insertion of the heat radiation member 1 is employed. As a result of this, the size of the housing 3 can be reduced.

Next, a modification example of the electronic apparatus 100 is described.

A shape of the main body portion 11 of the heat radiation member 1 may be a substantially plate shape, and may not be a complete plate shape. For example, a plate surface portion of the main body portion 11 may have irregularities by a heat pipe being provided. Hereinafter, the shape of the main body portion 11 may be simply referred to as a "plate shape".

A shape of the housing 3 may be a substantially bottomed box shape, and may not be a complete bottomed box shape. For example, as illustrated in FIG. 3, the holding portion 36 may be formed on an inner portion of the housing 3. Hereinafter, the shape of the housing 3 may be simply referred to as a "bottomed box shape".

A shape of the guide portion 32 is not limited to a substantially trapezoidal shape. When the main body portion 11 is inserted from the through hole 31 into the housing 3, the guide portion 32 may guide the main body portion 11 to a position in which contact between the lower circuit board 2_2 and the housing 3 is avoided. For example, the shape of the guide portion 32 may include at least the first inclined surface portion 33.

Figure 7:
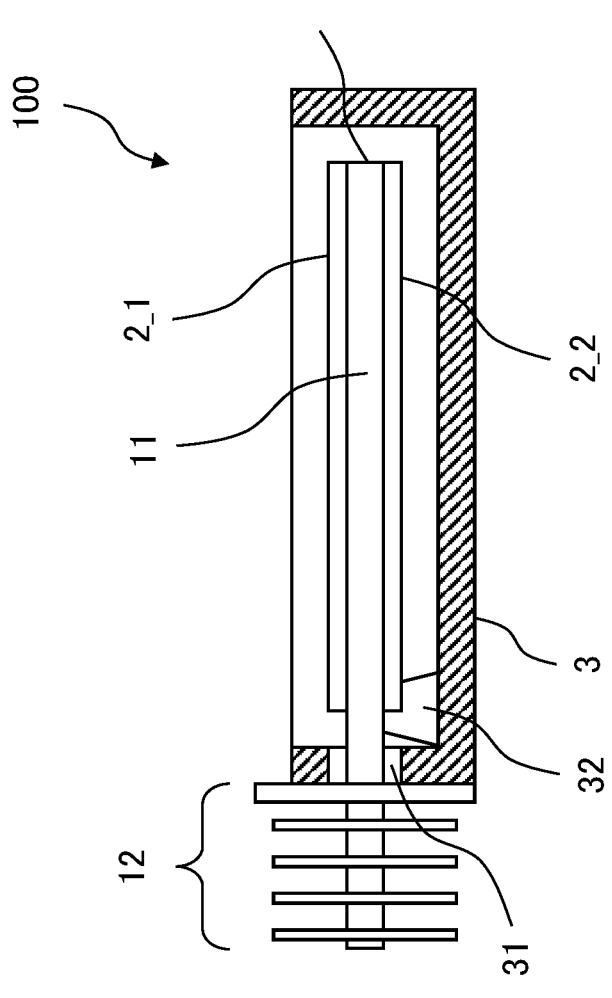
FIG. 7 is an explanatory diagram illustrating an overview of a structure of another electronic apparatus according to the first example embodiment.

As illustrated in FIG. 7, a main unit of the electronic apparatus 100 may be formed of the heat radiation member

1, the upper circuit board 2_1, the lower circuit board 2_2, and the housing 3. In other words, the electronic apparatus 100 may not include the waterproof member 5. Further, the electronic apparatus 100 may not include the lid 4. However, from a viewpoint of suppressing entry of liquid into the housing 3, it is suitable to provide the waterproof member 5. Further, from a viewpoint of suppressing entry of a foreign body into the housing 3, a viewpoint of protecting a circuit mounted on the upper circuit board 2_1, and the like, it is suitable to provide the lid 4.

While the invention has been particularly shown and described with reference to exemplary embodiments thereof, the invention is not limited to these embodiments. It will be understood by those of ordinary skill in the art that various changes in form and details may be made therein without departing from the spirit and scope of the present invention as defined by the claims.

A part or the whole of the example embodiments described above can be described as, but not limited to, the following supplementary notes.

SUPPLEMENTARY NOTE

[Supplementary Note 1]

A structure of an electronic apparatus comprising:

a heat radiation member including a main body portion having a plate shape;

an upper circuit board provided on a front surface portion of the main body portion;

a lower circuit board provided on a rear surface portion of the main body portion; and a housing having a bottomed box shape in which the main body portion, the upper circuit board, and the lower circuit board are housed, wherein a guide portion is formed on the housing, and the guide portion guides the main body portion to a position in which contact between the lower circuit board and the housing is avoided when the main body portion is inserted from a through hole of a wall surface portion of the housing into the housing in a state where the lower circuit board is attached to the main body portion.

[Supplementary Note 2]

The structure according to supplementary note 1, wherein the guide portion includes an inclined surface portion for guiding the main body portion in a direction in which the main body portion is held up when the main body portion is inserted from the through hole into the housing.

[Supplementary Note 3]

The structure according to supplementary note 1 or 2, wherein the guide portion is provided on both sides of the through hole.

[Supplementary Note 4]

The structure according to any one of supplementary notes 1 to 3, further comprising a waterproof member provided around the through hole.

[Supplementary Note 5]

The structure according to any one of supplementary notes 1 to 4, wherein a size of the upper circuit board in a longitudinal direction of the through hole is larger than a size of the main body portion in the longitudinal direction, and is larger than a size of the lower circuit board in the longitudinal direction.

[Supplementary Note 6]

The structure according to any one of supplementary notes 1 to 5, wherein the heat radiation member uses a heat pipe.

[Supplementary Note 7]

The structure according to any one of supplementary notes 1 to 6, further comprising a lid provided on a top portion of the housing.

[Supplementary Note 8]

A method for assembling an electronic apparatus, the method comprising:

inserting a main body portion having a plate shape of a heat radiation member from a through hole of a wall surface portion of a housing having a bottomed box shape into the housing in a state where a lower circuit board is attached to a rear surface portion of the main body portion;

attaching an upper circuit board to a front surface portion of the main body portion in a state where the main body portion is inserted into the housing; and guiding the main body portion to a position in which contact between the lower circuit board and the housing is avoided, by the main body portion abutting a guide portion of the housing when the main body portion is inserted from the through hole into the housing.

[Supplementary Note 9]

The assembly method according to supplementary note 8, further comprising guiding the main body portion in a direction in which the main body portion is held up, by the main body portion abutting an inclined surface portion of the guide portion when the main body portion is inserted from the through hole into the housing.

[Supplementary Note 10]

The assembly method according to supplementary note 8 or 9, further comprising attaching the upper circuit board to the main body portion from above the housing by using an opening of a top portion of the housing.

This application is based upon and claims the benefit of priority from Japanese patent application No. 2021-044793, filed on Mar. 18, 2021, the disclosure of which is incorporated herein in its entirety by reference.

REFERENCE SIGNS LIST

1 Heat radiation member
2_1 Upper circuit board
2_2 Lower circuit board
3 Housing
4 Lid
5 Waterproof member
11 Main body portion
12 Heat sink
13 First abutment surface portion
14 Second abutment surface portion
31 Through hole
32 Guide portion
33 First inclined surface portion (inclined surface portion)
34 Upper bottom portion
35 Second inclined surface portion
36 Holding portion

What is claimed is:

1. A structure of an electronic apparatus comprising:

a heat radiation member including a main body portion having a plate shape;

an upper circuit board provided on a front surface portion of the main body portion;

a lower circuit board provided on a rear surface portion of the main body portion; and a housing having a bottomed box shape in which the main body portion, the upper circuit board, and the lower circuit board are housed, wherein a guide portion is formed on the housing, the guide portion guides the main body portion to a position in which contact between the lower circuit board and the housing is avoided when the main body portion is inserted from a through hole of a wall surface portion of the housing into the housing in a state where the lower circuit board is attached to the main body portion, and the upper circuit board is configured to, in a state in which the main body portion is in the housing, attach to the front surface portion of the main body portion.

2. The structure according to claim 1, wherein the guide portion includes an inclined surface portion for guiding the main body portion in a direction in which the main body portion is held up when the main body portion is inserted from the through hole into the housing.

3. The structure according to claim 1, wherein the guide portion is provided on both sides of the through hole.

4. The structure according to claim 1, further comprising a waterproof member provided around the through hole.

5. The structure according to claim 1, wherein the heat radiation member uses a heat pipe.

6. The structure according to claim 1, further comprising a lid provided on a top portion of the housing.

7. A method for assembling an electronic apparatus, the method comprising:

inserting a main body portion having a plate shape of a heat radiation member from a through hole of a wall surface portion of a housing having a bottomed box shape into the housing in a state where a lower circuit board is attached to a rear surface portion of the main body portion;

attaching an upper circuit board to a front surface portion of the main body portion in a state where the main body portion is inserted into the housing; and guiding the main body portion to a position in which contact between the lower circuit board and the housing is avoided, by the main body portion abutting a guide portion of the housing when the main body portion is inserted from the through hole into the housing.

8. The assembly method according to claim 7, further comprising guiding the main body portion in a direction in which the main body portion is held up, by the main body portion abutting an inclined surface portion of the guide portion when the main body portion is inserted from the through hole into the housing.

9. The assembly method according to-claim 7, further comprising attaching the upper circuit board to the main body portion from above the housing by using an opening of a top portion of the housing.

* * * * *